US011152130B2

United States Patent
Akinwande et al.

(10) Patent No.: US 11,152,130 B2
(45) Date of Patent: Oct. 19, 2021

(54) NANOSCALE X-RAY TOMOSYNTHESIS FOR RAPID ANALYSIS OF INTEGRATED CIRCUIT (IC) DIES

(71) Applicant: Massachusetts Institute of Technology, Cambridge, MA (US)

(72) Inventors: Akintunde I. Akinwande, Newton, MA (US); Berthold Klaus Paul Horn, Chatham, NH (US); Richard C. Lanza, Brookline, MA (US); George Barbastathis, Boston, MA (US); Rajiv Gupta, Boston, MA (US); Jonah Jacob, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/325,936

(22) PCT Filed: Aug. 15, 2017

(86) PCT No.: PCT/US2017/047030
§ 371 (c)(1),
(2) Date: Feb. 15, 2019

(87) PCT Pub. No.: WO2018/035171
PCT Pub. Date: Feb. 22, 2018

(65) Prior Publication Data
US 2019/0206652 A1 Jul. 4, 2019

Related U.S. Application Data

(60) Provisional application No. 62/375,503, filed on Aug. 16, 2016.

(51) Int. Cl.
*G01N 23/04* (2018.01)
*G01N 23/083* (2018.01)
(Continued)

(52) U.S. Cl.
CPC .............. *G21K 7/00* (2013.01); *G01N 23/041* (2018.02); *G01N 23/044* (2018.02);
(Continued)

(58) Field of Classification Search
CPC .............. H01J 35/065; H01J 2235/068; G01N 23/044; G01N 2223/6113; H01L 22/12
(Continued)

(56) References Cited

U.S. PATENT DOCUMENTS

| 5,930,314 A | 7/1999 | Lanza |
| 7,082,182 B2 * | 7/2006 | Zhou ..................... A61B 6/032 |
| | | 378/10 |

(Continued)

FOREIGN PATENT DOCUMENTS

WO   WO 2011/044199 A1   4/2011

OTHER PUBLICATIONS

Invitation to Pay Additional Fees dated Oct. 30, 2017 in connection with International Application No. PCT/US2017/047030.
(Continued)

*Primary Examiner* — Thomas R Artman
(74) *Attorney, Agent, or Firm* — Wolf, Greenfield & Sacks, P.C.

(57) ABSTRACT

System and method for imaging an integrated circuit (IC). The imaging system comprises an x-ray source including a plurality of spatially and temporally addressable electron sources, an x-ray detector arranged such that incident x-rays are oriented normal to an incident surface of the x-ray detector and a three-axis stage arranged between the x-ray source and the x-ray detector, the three-axis stage configured to have mounted thereon an integrated circuit through which x-rays generated by the x-ray source pass during operation of the imaging system. The imaging system further comprises at least one controller configured to move the three-
(Continued)

axis stage during operation of the imaging system and selectively activate a subset of the electron sources during movement of the three-axis stage to acquire a set of intensity data by the x-ray detector as the three-axis stage moves along a three-dimensional trajectory.

22 Claims, 6 Drawing Sheets

(51) Int. Cl.
| H01J 35/12 | (2006.01) |
| H01J 35/18 | (2006.01) |
| H01J 35/06 | (2006.01) |
| G21K 7/00 | (2006.01) |
| G01N 23/044 | (2018.01) |
| H01L 21/66 | (2006.01) |
| G01N 23/041 | (2018.01) |

(52) U.S. Cl.
CPC .......... *G01N 23/083* (2013.01); *H01J 35/065* (2013.01); *H01J 35/12* (2013.01); *H01J 35/186* (2019.05); *H01L 22/12* (2013.01); *G01N 2223/1016* (2013.01); *G01N 2223/321* (2013.01); *G01N 2223/3307* (2013.01); *G01N 2223/427* (2013.01); *G01N 2223/6113* (2013.01); *G01N 2223/6116* (2013.01); *G01N 2223/645* (2013.01); *G01N 2223/6462* (2013.01); *H01J 2235/062* (2013.01); *H01J 2235/068* (2013.01); *H01J 2235/1204* (2013.01); *H01J 2235/183* (2013.01)

(58) Field of Classification Search
USPC .......................................................... 378/122
See application file for complete search history.

(56) References Cited

U.S. PATENT DOCUMENTS

| 7,920,673 | B2 | 4/2011 | Lanza et al. | |
| 7,940,888 | B2* | 5/2011 | Tsujii | A61B 6/4007 378/21 |
| 8,290,118 | B2* | 10/2012 | Tsujii | A61B 6/4007 378/21 |
| 9,129,715 | B2* | 9/2015 | Adler | H01L 22/12 |
| 9,279,775 | B2* | 3/2016 | Tsujii | G01N 23/046 |
| 9,607,724 | B2* | 3/2017 | Adler | G21K 7/00 |
| 9,646,732 | B2* | 5/2017 | Adler | G01N 23/04 |
| 10,045,752 | B2 | 8/2018 | Gupta et al. | |
| 10,068,740 | B2 | 9/2018 | Gupta et al. | |
| 10,591,424 | B2* | 3/2020 | Morton | H01J 35/045 |
| 2003/0198318 | A1* | 10/2003 | Price | H01J 35/065 378/122 |
| 2004/0213378 | A1* | 10/2004 | Zhou | A61B 6/508 378/122 |
| 2005/0074088 | A1* | 4/2005 | Ichihara | G01N 23/046 378/58 |
| 2006/0008047 | A1* | 1/2006 | Zhou | A61B 6/032 378/10 |
| 2006/0054879 | A1* | 3/2006 | Jin | H01J 9/025 257/10 |
| 2006/0202125 | A1* | 9/2006 | Suhami | G01T 1/2985 250/368 |
| 2007/0009081 | A1* | 1/2007 | Zhou | H01J 35/065 378/10 |
| 2007/0053489 | A1* | 3/2007 | Lu | G01N 23/04 378/62 |
| 2007/0085459 | A1* | 4/2007 | Hudspeth | H01J 9/025 313/309 |
| 2007/0195927 | A1* | 8/2007 | Fung | G01N 23/04 378/58 |
| 2007/0206726 | A1* | 9/2007 | Lu | G01N 23/203 378/146 |
| 2007/0247048 | A1* | 10/2007 | Zhang | B82Y 10/00 313/311 |
| 2010/0189223 | A1* | 7/2010 | Eaton | G21K 1/025 378/68 |
| 2010/0290593 | A1* | 11/2010 | Legagneux | H01J 35/065 378/122 |
| 2010/0329416 | A1* | 12/2010 | Tsujii | A61B 6/589 378/21 |
| 2011/0188628 | A1* | 8/2011 | Tsujii | A61B 6/587 378/21 |
| 2011/0249802 | A1* | 10/2011 | Okunuki | A61B 6/4233 378/124 |
| 2011/0299653 | A1* | 12/2011 | Mishra | G01N 23/02 378/9 |
| 2012/0008739 | A1 | 1/2012 | Hoernig et al. | |
| 2012/0025110 | A1* | 2/2012 | Davis | C01B 32/158 250/505.1 |
| 2012/0057669 | A1* | 3/2012 | Vogtmeier | H01J 35/06 378/4 |
| 2012/0106702 | A1 | 5/2012 | Feke | |
| 2012/0140895 | A1* | 6/2012 | Okunuki | H01J 35/08 378/122 |
| 2012/0170718 | A1* | 7/2012 | Travish | H01J 35/065 378/122 |
| 2012/0307974 | A1* | 12/2012 | Yamazaki | H01J 35/08 378/62 |
| 2012/0318987 | A1* | 12/2012 | Miyazaki | H01J 35/08 250/358.1 |
| 2013/0003920 | A1* | 1/2013 | Tsujii | G01N 23/046 378/21 |
| 2013/0063731 | A1* | 3/2013 | Gaspardo | G06T 7/579 356/601 |
| 2013/0202082 | A1* | 8/2013 | Okunuki | A61B 6/4035 378/37 |
| 2013/0272503 | A1 | 10/2013 | Eaton | |
| 2014/0064445 | A1* | 3/2014 | Adler | G21K 7/00 378/43 |
| 2014/0140484 | A1* | 5/2014 | Shiraki | H05G 1/70 378/98 |
| 2014/0205058 | A1 | 7/2014 | Tagawa | |
| 2014/0211919 | A1* | 7/2014 | Ogura | H01J 35/08 378/62 |
| 2014/0241492 | A1* | 8/2014 | Tamura | H01J 35/16 378/22 |
| 2014/0301528 | A1 | 10/2014 | La Riviere | |
| 2014/0369471 | A1* | 12/2014 | Ogura | H01J 35/08 378/62 |
| 2015/0016593 | A1* | 1/2015 | Larson | H01J 5/18 378/161 |
| 2015/0124934 | A1* | 5/2015 | Gupta | H01J 35/065 378/122 |
| 2015/0146848 | A1* | 5/2015 | Gupta | A61B 6/40 378/57 |
| 2015/0155134 | A1 | 6/2015 | Frosien et al. | |
| 2015/0270023 | A1* | 9/2015 | Adler | G01N 23/04 378/43 |
| 2016/0351283 | A1* | 12/2016 | Adler | H01L 22/12 |
| 2016/0372298 | A1* | 12/2016 | Evans | H01J 35/065 |
| 2017/0004949 | A1* | 1/2017 | Kenmotsu | H01J 35/08 |
| 2017/0025317 | A1* | 1/2017 | Tingay | H01L 21/67288 |
| 2017/0031053 | A1* | 2/2017 | Kumar | G01V 5/005 |
| 2017/0050046 | A1 | 2/2017 | Walder et al. | |
| 2017/0162359 | A1* | 6/2017 | Tang | H01J 35/065 |
| 2017/0200524 | A1* | 7/2017 | Adler | H01L 22/12 |
| 2017/0231582 | A1* | 8/2017 | Ro | H01J 35/08 378/40 |
| 2019/0206652 | A1* | 7/2019 | Akinwande | G01N 23/044 |
| 2020/0085392 | A1* | 3/2020 | Lanza | G01N 23/044 |

OTHER PUBLICATIONS

International Search Report and Written Opinion dated Jan. 9, 2018 in connection with International Application No. PCT/US2017/047030.

(56) References Cited

OTHER PUBLICATIONS

International Preliminary Report on Patentability dated Feb. 28, 2019 in connection with International Application No. PCT/US2017/047030.
[No Author Listed], ntCT Forward-Thinking Nano CT. Fraunhofer EZRT. To the best of our knowledge the date of this reference is Apr. 17, 2019. 2 pages.
Ando et al., Crystal analyser-based X-ray phase contrast imaging in the dark field: implementation and evaluation using excised tissue specimens. European radiology. Feb. 1, 2014;24(2):423-33.
Ando et al., Dark-Field Imaging: Recent developments and potential clinical applications. Physica Medica. Dec. 1, 2016;32(12):1801-12.
Ando et al,. Tissue visualization using X-ray dark-field imaging towards pathological goal. IOP Publishing, Journal of Physics: Conference Series. 2013;425(19):192006-9.
Boland et al., The potential of cryo-electron microscopy for structure-based drug design. Essays in biochemistry. Nov. 8, 2017;61(5):543-60.
Bunch et al., Impermeable atomic membranes from graphene sheets. Nano letters. Aug. 13, 2008;8(8):2458-62.
Correia et al., Advanced vibration suppression algorithms in adaptive optics systems. Journal of the Optical Society of America A. Mar. 1, 2012;29(3):185-94.
Davis, Using a light microscope to measure motions with nanometer accuracy. Optical Engineering. Apr. 1998;37:1299-304.
Devaney, Inverse-scattering theory within the rytov approximation. Optics Letters. Aug. 1, 1981;6(8):374-6.
Gaglia et al., Noninvasive mapping of pancreatic inflammation in recent-onset type-1 diabetes patients. Proceedings of the National Academy of Sciences. Feb. 17, 2015;112(7):2139-44.
Guerrera et al., Nanofabrication of arrays of silicon field emitters with vertical silicon nanowire current limiters and self-aligned gates. Nanotechnology. Jun. 13, 2016;27(29):295302-12.
Harisinghani et al., Noninvasive detection of clinically occult lymph-node metastases in prostate cancer. New England Journal of Medicine. 2003;348(25):2491-2499.
Heintzmann et al., Super-resolution structured illumination microscopy. Chemical Reviews. 2017;117:13890-13908.
Ielmini, Resistive switching memories based on metal oxides: mechanisms, reliability and scaling. Semiconductor Science and Technology. 2016; 31(6):063002.
Kalender, X-ray computed tomography. Physics in Medicine & Biology. Jun. 20, 2006;51(13):R29-43.
Kampschulte et al., A. Nano-computed tomography: Technique and applications. RöFo-Fortschritte auf dem Gebiet der Röntgenstrahlen und der bildgebenden Verfahren. Feb. 2016;188(02):146-154.
Kirsch, Basic principles of magnetic resonance contrast agents. Top Magn Reson Imaging. 1991;3(2):1-18.
Kirschbaum et al., In vivo nanoparticle imaging of innate immune cells can serve as a marker of disease severity in a model of multiple sclerosis. Proceedings of the National Academy of Sciences. Nov. 15, 2016;113(46):13227-32.
Kornguth et al., Magnetic resonance imaging of gadolinium-labeled monoclonal antibody polymers directed at human T lymphocytes implanted in canine brain. Journal of neurosurgery. Jun. 1, 1987;66(6):898-906.
Langer et al., Scientific discovery and the future of medicine. JAMA. 2015;313:135-6.
Lee et al., Excellent uniformity and reproducible resistance switching characteristics of doped binary metal oxides for non-volatile resistance memory applications. IEEE. 2006 International Electron Devices Meeting. Dec. 2006;1-4.
Li et al., Efficient and self-adaptive in-situ learning in multilayer memristor neural networks. Nature Communications. 2018; 9(1):2385.
Li et al., Three-dimensional crossbar arrays of self-rectifying Si/SiO 2/Si memristors. Nature Communications. 2017;8:15666.
Li, Ultrathin graphene oxide membranes/coatings for separations. Chemical Engineering, University of South Carolina Master's Thesis. 2014:113 pages.
Lutter et al., XRM-II nanoCT-SEM based computed tomography. International Symposium on Digital Industrial Radiology and Computed Tomography—DIR2019. To the best of our knowledge the date of this reference is Jul. 2, 2019. 7 pages.
Mccord et al., Reb1: Design progress toward 16 nm half-pitch maskless projection electron beam lithography. SPIE Proceedings. Mar. 21, 2012;8323:832311-832321.
Miller et al., Imaging the pharmacology of nanomaterials by intravital microscopy: Toward understanding their biological behavior. Adv Drug Deliv Rev. 2017;113:61-86.
Miller et al., Predicting therapeutic nanomedicine efficacy using a companion magnetic resonance imaging nanoparticle. Science translational medicine. Nov. 18, 2015;7(314):314ra183.
Miller et al., Tumour-associated macrophages act as a slow-release reservoir of nano-therapeutic Pt (IV) pro-drug. Nature communications. Oct. 27, 2015;6(1):1-13.
Neice, Methods and limitations of subwavelength imaging. Advances in Imaging and Electron Physics. 2010;163:117-140.
Pan et al., Contrast enhancement in x-ray phase contrast tomography. Optics Express. Jul. 28, 2014;22(15):18020-6.
Pathania et al., Holographic assessment of lymphoma tissue (HALT) for global oncology field applications. Theranostics. 2016;6(10):1603-1610.
Pathania et al.. Holographic assessment of lymphoma tissue for global oncology field applications. Theranostics. 2016:1603-1610.
Pattni et al., New developments in liposomal drug delivery. Chemical reviews. Oct. 14, 2015;115(19):10938-66.
Prost, Logic Circuits with reduced complexity based on devices with higher functionality. IST, EU IST Rep. LOCOM. 2000;28:844.
Pulli et al., Multiple sclerosis: myeloperoxidase immunoradiology improves detection of acute and chronic disease in experimental model. Radiology. May 2015;275(2):480-9.
Sheridan, Proof of concept for next-generation nanoparticle drugs in humans. Nat Biotechnol. 2012;30(6):471-473.
Sinha et al., Lensless computational imaging through deep learning. Optica. Sep. 20, 2017;4(9):1117-25.
Skinner-Ramos et al., Toward phase-recovery optical nanoscopes. Journal of Physical Science and Application. 2017;7(5):19-27.
Sunaguchi et al., An efficient reconstruction algorithm for differential phase-contrast tomographic images from a limited number of views. Applied Physics Letters. Dec. 21, 2015;107(25):253701.
Sunaguchi et al., In vitro validation of an artefact suppression algorithm in X-ray phase-contrast computed tomography. PloS one. Aug. 21, 2015;10(8):e0135654.
Sunaguchi et al., Limited view reconstruction for differential phase-contrast computed tomography. Optics express. Apr. 20, 2015;23(8):9717-29.
Sung et al., Compressed x-ray phase-contrast imaging using a coded source. Optics Communications. Dec. 1, 2014;332:370-378.
Sung et al., Full-wave approach for x-ray phase imaging. Optics express. Jul. 29, 2013;21(15):17547-57.
Sung et al., Phase-contrast imaging with a compact x-ray light source: system design. Journal of Medical Imaging. Nov. 2017;4(4):043503.
Sung et al., Realistic wave-optics simulation of x-ray phase-contrast imaging at a human scale. Scientific Reports. Jul. 14, 2015;5:12011.
Sung et al., X-ray phase tomography of a moving object. Optics express. Oct. 7, 2013;21(20):23671-9.
Turetsky et al., On chip analysis of cns lymphoma in cerebrospinal fluid. Theranostics. 2015:5:796-804.
Unger et al., Magnetic resonance imaging using gadolinium labeled monoclonal antibody. Investigative Radiology. Oct. 1, 1985;20(7):693-700.
Wang et al., Improving the electrical performance of resistive switching memory using doping technology. Chinese Science Bulletin. 2012;57(11):1235-1240.
Wicki et al., Nanomedicine in cancer therapy: challenges, opportunities, and clinical applications. Journal of controlled release. Feb. 28, 2015;200:138-57.

(56) References Cited

OTHER PUBLICATIONS

Wu et al., Electromagnetically induced transparency in V-, Λ-, and cascade-type schemes beyond steady-state analysis. Physical Review A. May 12, 2005;71(5):053806.
U.S. Appl. No. 17/020,734, filed Sep. 14, 2020, Lanza et al.

* cited by examiner

NANOSCALE X-RAY TOMOSYNTHESIS FOR RAPID ANALYSIS OF INTEGRATED CIRCUIT (IC) DIES

RELATED APPLICATIONS

This Application is a national stage filing under 35 U.S.C. 371 of International Patent Application No. PCT/US2017/047030, filed Aug. 15, 2017, entitled "NANOSCALE X-RAY TOMOSYNTHESIS FOR RAPID ANALYSIS OF INTEGRATED CIRCUIT (IC) DIES", which claims the benefit of U.S. Provisional Patent Application No. 62/375,503, filed Aug. 16, 2016, entitled "NANOSCALE XRAY TOMOSYNTHESIS FOR RAPID ANALYSIS OF IC DIES (NEXT-RAID)," each of which is hereby incorporated by reference in its entirety.

BACKGROUND

Microscopic X-ray imaging techniques can be broadly classified into two categories: those that are direct-image forming (i.e., the image formed on the sensor directly corresponds with the imaged object), and those that rely on computational imaging to reconstruct an image of the object. Direct-imaging utilizes a combination of x-ray optical elements including: Fresnel zone plates, Laue lenses/crystals, and highly-polished mirrors in the image formation process. Although these techniques have achieved sub-10 nm resolution, the considerable energy loss introduced by x-ray optical elements has meant that these techniques all require a substantial photon flux, which has so far only been available in larger facilities (e.g., at synchrotrons). As a result, direct-image forming x-ray microscopy is largely unsuitable for compact imaging setups.

Computational x-ray imaging involves acquiring a sequence of images under different imaging geometries or conditions (an approach also referred to as "diversity") and computationally combining these images (which individually may not look like the object at all) together to reconstruct a representation of the object. This way, it is possible, for example, to reconstruct phase contrast information in addition to standard attenuation information, the former often holding more information about the underlying object. The computational approaches to x-ray phase imaging can be classified into three main categories: (1) methods based on the use of crystal analyzers, (2) propagation-based imaging methods, and (3) grating-based interferometry.

SUMMARY

Some embodiments are directed to an imaging system for imaging an integrated circuit (IC). The imaging system comprises an x-ray source including a plurality of spatially and temporally addressable electron sources, an x-ray detector arranged such that incident x-rays are oriented normal to an incident surface of the x-ray detector, a three-axis stage arranged between the x-ray source and the x-ray detector, the three-axis stage configured to have mounted thereon an integrated circuit through which x-rays generated by the x-ray source pass during operation of the imaging system, and at least one controller. The at least one controller is configured to move the three-axis stage during operation of the imaging system and selectively activate a subset of the electron sources during movement of the three-axis stage to acquire a set of intensity data by the x-ray detector as the three-axis stage moves along a three-dimensional trajectory.

Other embodiments are directed to a method of imaging an integrated circuit using an imaging device comprising a plurality of electron sources, an x-ray detector and a three-axis stage arranged between the plurality of electron sources and the x-ray detector and configured to have mounted thereon the integrated circuit. The method comprises moving, using at least one controller, the three-axis stage during operation of the imaging system and selectively activating a subset of the electron sources during movement of the three-axis stage to acquire a set of intensity data by the x-ray detector as the three-axis stage moves along a three-dimensional trajectory.

Some embodiments are directed to a long lifetime modular cathode based on a 2D array of field emitters, each individually regulated by a silicon nano-wire current limiter.

Some embodiments are directed to an array of nano-focused x-ray sources with a micro-channel cooled transmission-type anode for generating characteristic x-rays with low background of bremsstrahlung emission.

Some embodiments are directed to an X-ray imaging platform that combines absorption and phase contrast with a potential to distinguish between several materials with low atomic number (Z).

Some embodiments are directed to algorithms for coded source imaging with an ability to boost end-to-end image resolution by over 1000×.

Some embodiments are directed to a novel tomosynthesis algorithm for image reconstruction of planar, layer-by-layer decomposition of an IC using both attenuation and phase contrast in order to discern metal layers and to distinguish different types of semiconductor materials.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
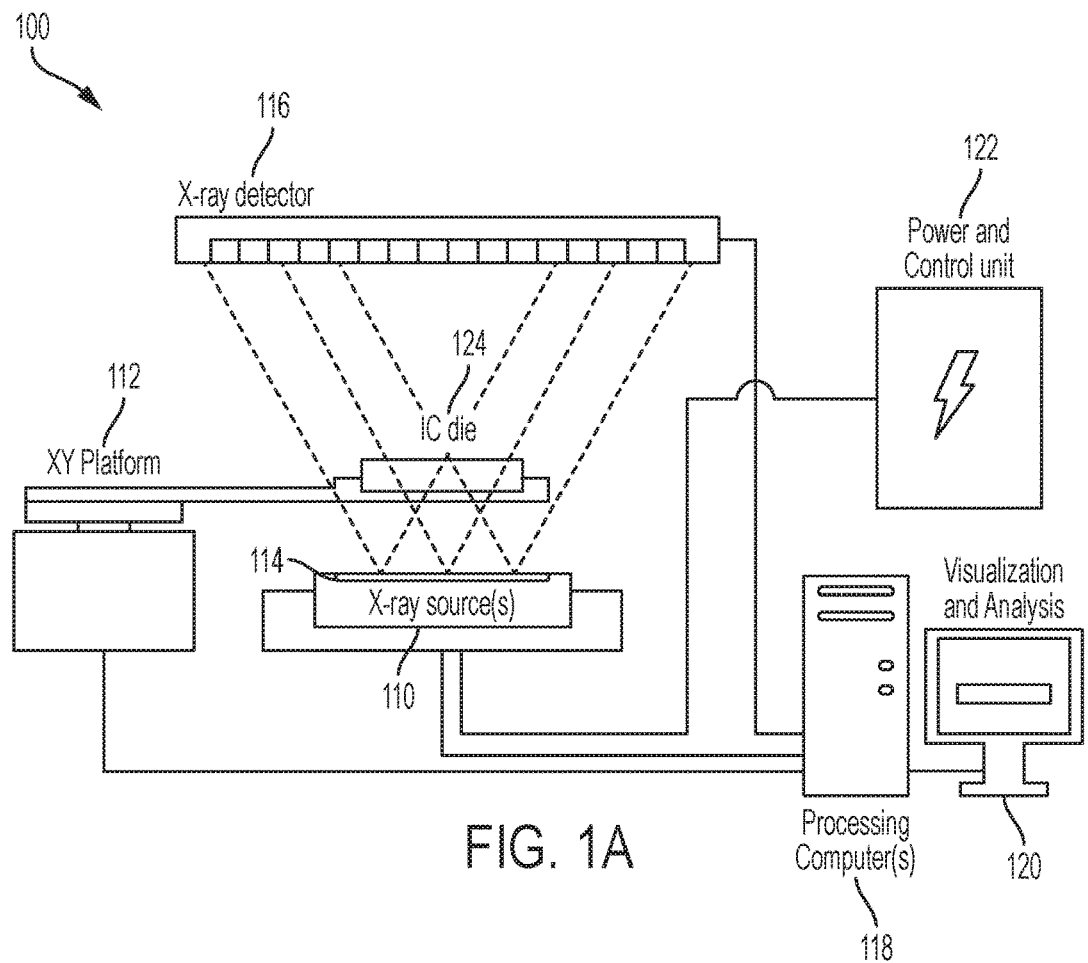
FIGS. 1A and 1B illustrate components of an imaging system for imaging an integrated circuit (IC) in accordance with some embodiments.

Rapid advances have been observed in 3D volumetric imaging of integrated circuits using x-ray microscopes in the past few years. Such advances are typically based on Fresnel zone plates, computed tomography and a monochromatic x-ray source. At least two approaches have been demonstrated. One approach is based on a laboratory x-ray source. It has low photon flux because of the need for beams with directional x-rays that are nearly mono-chromatic. Another approach is based on a synchrotron, which has high photon flux. Both approaches demonstrated sub-30 nm resolution; however, the wall plug energy efficiency for generating the "coherent" monochromatic x-ray beam is of the order of $10^{-8}$. This places a severe limitation on either the speed or location of image acquisition. Ideally, an x-ray microscope that has the same form factor and cost as a semiconductor test tool is desired.

In the realm of laboratory sources, grating-based interferometry and free space propagation based imaging are the most commonly used techniques for X-ray phase imaging. In recent years, grating-based interferometry has seen significant advancements in quality and has even seen extensions into tomographic imaging. However, to accommodate ~10-nanometer scale imaging resolution, gratings become subject to severe manufacturing errors; this imposes a significant resolution loss. With non-synchrotron sources, propagation based imaging is likely to provide the highest possible spatial resolution for X-ray phase imaging. In propagation based imaging, a full solution for attenuation and phase requires multidimensional intensity measurements. Several methods have been proposed to reduce the number of intensity measurements needed for reconstruction, thus significantly reducing acquisition complexity. Of particular interest are methods based on the Contrast Transfer Function (CTF) and the Transport of intensity Equation (TIE). CTF methods assume weak absorption of the object, which does not hold when imaging ICs. TIE methods, on the other hand, do not impose any restrictions other than the paraxial approximation, which is hard to violate in the X-ray regime; moreover, TIE can recover the optical density (or optical path length, OPL) of the object even under spatially partially coherent illumination conditions (under such conditions, "phase" becomes ill-defined, but it is usually the OPL that is of interest).

In accordance with some embodiments, TIE-based techniques are combined with coded source imaging to simultaneously retrieve high-resolution phase contrast as well as 3D information about the imaged object(s). For samples assumed to be thin, multi-angled illumination has traditionally been utilized to provide information about the phase of the imaged object or enhanced resolution. However, images obtained via multi-angle (coded source) illumination contain not only information about the phase of the object (enabling phase contrast imaging and enhanced resolution) but are also partially tomographic in nature, enabling tomosynthesis.

Digital tomosynthesis, which was originally developed as an alternative modality for projection X-ray mammography, has become a general-purpose tomographic technique that is especially suited for objects with planar organization. It is widely used because of its high in-plane resolution, high contrast resolution, and high detectability of target regions. While it is generally not applied for planar reconstruction of IC dies, the inherent strengths of this technique make it especially suitable for imaging ICs. In digital tomosynthesis, the detector plane and object are typically fixed; and the X-ray source rotates or translates to provide only a limited number of angular projections. The digital 3-D image is reconstructed, plane by plane, from these projection measurements. There are two drawbacks to this approach. Firstly, translating/rotating gantries introduce significant additional mechanical instability to the system, resulting in motion blur or misalignment artifacts. Secondly, limited angular views fail to adequately sample Radon space, and traditional reconstruction methods produce severe artifact and non-isotropic depth resolution when applied to these limited projections. To achieve very high spatial resolutions (e.g., on the order of nm), the image quality using conventional filtered back-projection (FBP) techniques is unsatisfactory due to limited angular projections.

To address these issues, instead of using mechanical rotation to perform tomosynthesis, some embodiments simulate rotation through a coded source. By translating the illumination pattern across emitters on the source, measurements can be made in a static, mechanically stable manner. The simulated translation can occur in 2D, enabling a more complete coverage of Radon space and resulting in a more accurate image reconstruction.

High-yield manufacturing of integrated circuits (ICs) at feature sizes of 7-10 nm requires high-speed and high-resolution image acquisition for process verification and failure analysis. This task is further compounded by the fact that with increasing number of interconnect-layers, IC chips have become three-dimensional. The introduction of new technologies such as "through silicon via" (TSV) have made possible vertical stacking of IC chips from different technologies to form "Systems-on-a-Chip" (SOC). Most in- and post-process inspection tools are two-dimensional making it extremely difficult to debug fabrication processes without labor-intensive "layer-by-layer" imaging with subsequent assembly of the images, a process that is very susceptible to errors. It has thus become imperative to develop alternative approaches that enable volumetric imaging of IC chips. A potential approach to non-destructive imaging of IC chips in a time-sensitive manner requires the use of penetrating radiation such as x-rays. Assuming a typical IC chip having characteristics—1 cm×1 cm size, 13 layers of metal, 13 layers of contact metal and silicon layers that include the shallow trench isolation—when scanned at a resolution of 10 nm, the number of voxels in a three dimensional image of the chip would be of the order of $10^{15}$, This creates an enormous challenge for image acquisition and processing.

To this end, some embodiments are directed to an analysis tool (also referred to herein as "NeXT-RAID") capable of volumetric imaging of Si IC chips with minimum size circuit features down to 10 nm. In some embodiments, NeXT-RAID enables 3D reconstruction of IC chips for circuit debugging or failure analysis and is capable of acquiring images and reconstructing all circuit layers with 100% accuracy in less than 25 days. Other embodiments are directed to conducting an "inverse chip layout" to translate 3D reconstructed images into a mask layout.

Some embodiments are directed to a system for non-destructively acquiring images using an x-ray microscope and reconstructing the images in 3D using tomosynthesis and computational imaging for "virtual delayering" IC chips at an isotropic resolution to 10 nm via an overall image magnification of >1000.

FIG. 1A schematically illustrates components of an imaging system 100 in accordance with some embodiments. System 100 includes an array of spatially and temporally addressable nano-focused x-ray sources 110. In some embodiments, x-ray sources 110 are based on cold cathodes, an example of which is discussed in more detail below. System 100 also includes a high precision platform 112 for nano positioning of IC chips. In some embodiments high precision platform 112 is integrated with a high precision nano-positioning stage that has, for example, 1 nm translation resolution and 7 mm travel in the x-y dimensions, 0.2 nm resolution and 100 μm travel in the z-direction and 360 degrees rotation.

System 100 also includes x-ray optics 114 for image magnification and focusing and a high resolution x-ray detector 116 consisting of an array of sensing elements. Modern imaging detectors for soft x-rays (e.g., cooled CCDs) operate in either direct mode where the x-ray interacts in the silicon pixel, or in indirect mode where a phosphor is deposited on the pixel. In the 10-3D keV energy range, the indirect approach is typically the most practical as it avoids the use of specialized imagers such as deep depletion, back illuminated devices.

In some embodiments, x-ray detector 116 is implemented as a high-resolution camera. The high-resolution camera may be arranged so that the incident x-rays are normal to the plane of the camera chip, minimizing parallax effects in the phosphor. Pixel size, though important for resolution, can to some extent be adjusted through changes in magnification. The large magnification in some embodiments yields a corresponding large number of pixels that must be available for imaging. For example, for an ultimate resolution of 10 nm, a 1 mm ($10^6$ nm) sized imaging area on the chip will have $10^5$ pixels on a side ($10^6$ nm/10 nm pixel size). Therefore 10 Gpixels may be required for storing the image of a 1 mm×1 mm section of an imaged IC, with a total of 1000 Gpixels required for imaging the entire IC assuming a 1 cm×1 cm chip size. Multiple such images may be acquired and processed by a tomosynthesis algorithm in accordance with some embodiments, as discussed in more detail below.

Some embodiments utilize reconstruction and imaging that is localized such that it is not necessary to obtain all of the pixels comprising the chip in order to reconstruct a localized area. Although Gpixel arrays have been implemented by stitching together many sensors, some embodiments limit the size of the scanned area on the chip to closely match large commercial chips. Recent work has shown that commercial DSLR cameras can be made to perform at the level of cooled CCDs with the advantage of lower cost and commercial availability. For example, the imager in a modern DSLR camera such as a Nikon D810 is 7360×4912 pixels (36.3 Mpixels) with 4.88 μm pixels. When coupled with a scintillator plate and magnification, such a camera may be used as the detector 116 in accordance with some embodiments. Optical magnification may be used with the DSLR camera to achieve an effective pixel size of 1 micron on the scintillator.

Figure 1B:
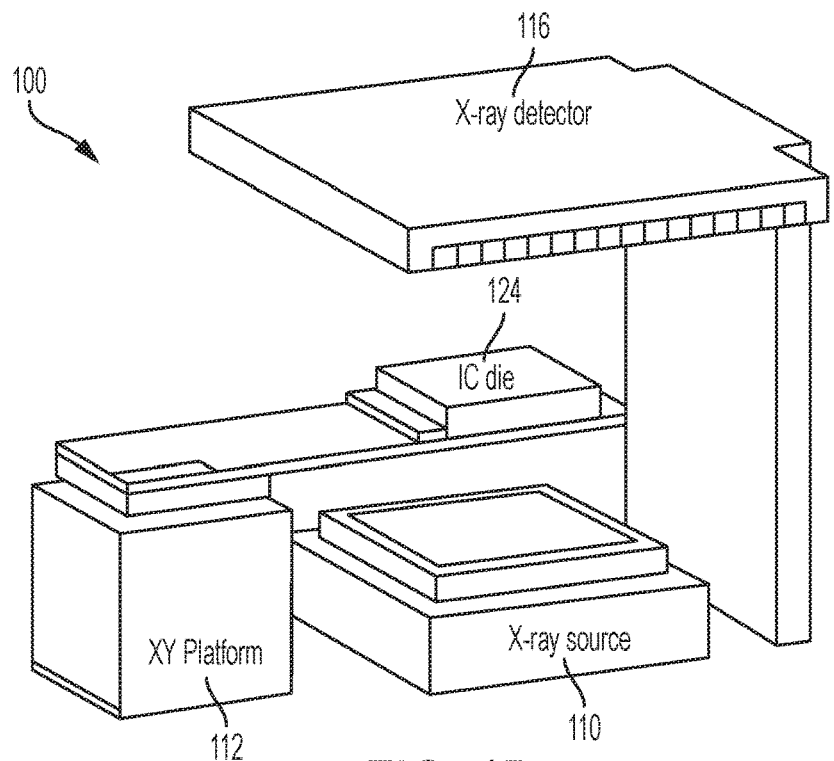

System 100 also includes one or more processing computers 118 comprising at least one processor programmed to perform a tomosynthesis reconstruction of 3D images and one or more one or more displays 120 coupled to processing computer(s) 118 for displaying results of processing performed by processing computer(s) 118. System 100 also includes power and control unit 122 configured to provide operating power to one or more components of system 100. System 100 is configured to image IC die 124. FIG. 1B shows an alternative view of some components of system 100.

In some embodiments, system 100 is configured to perform one or more of coded source imaging, computational imaging for improving image resolution, and IC chip deconstruction for visualization and layout comparison. Below is a more detailed description of the components in system 100 including non-limiting examples for implementing each component. For ease of description, the components of system 100 are grouped into four major categories: (A) Nano-focused X-ray source, (B) X-ray optics for tomography, (C) High-resolution image acquisition and tomographic reconstruction, and (D) An analytical framework for justification of expected performance metrics.

Spatially and Temporally Addressed Nano-Focused X-Ray Source

X-ray source(s) 110 in accordance with some embodiments includes an array of cold cathodes with electron beams focused down to 5 nm using Einzel lenses. Electrons from the e-beams are accelerated to high voltage (20-40 kV) in a vacuum enclosure and collide with a transmission-type anode made of an array of high-Z metals on a low-Z membrane (e.g., a Be window) to generate characteristic x-rays with bremsstrahlung x-ray background suppressed. The electron sources can be spatially or temporally addressed leading to spatial and temporal modulation of the x-rays.

A high current density and a long lifetime cold cathode capable of operating in poor vacuum is achieved in some embodiments by virtue of: (1) coating the field emitter tips with thin layer of Ir/Pt, (2) individually limiting current through them by fabricating a high aspect ratio silicon nanowire in series with them, and (3) isolating the emitters via a thin membrane window that is transparent to electrons emitted on the ultra-high vacuum (UHV) side but impervious to gas molecules or ions generated on the poor vacuum side. This structure, fabricated using MEMS technology, forms a Modular Cold Cathode for use with some embodiments that keeps the field emitter tips under UHV and a pristine environment while the rest of the x-ray source may be in a relatively poor vacuum.

Figure 2:
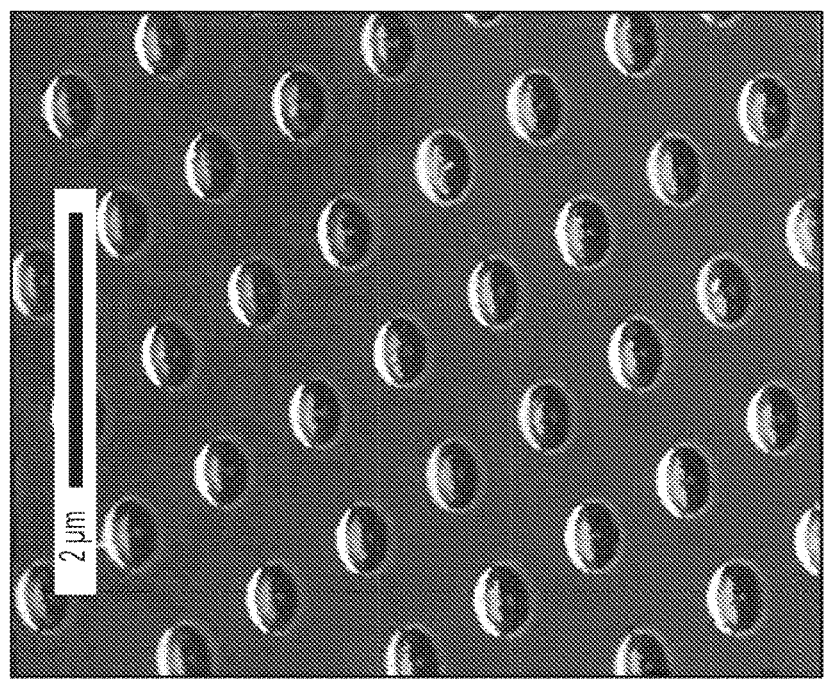
FIG. 2 illustrates a field emitter array x-ray source for use with some embodiments.
Figure 2:
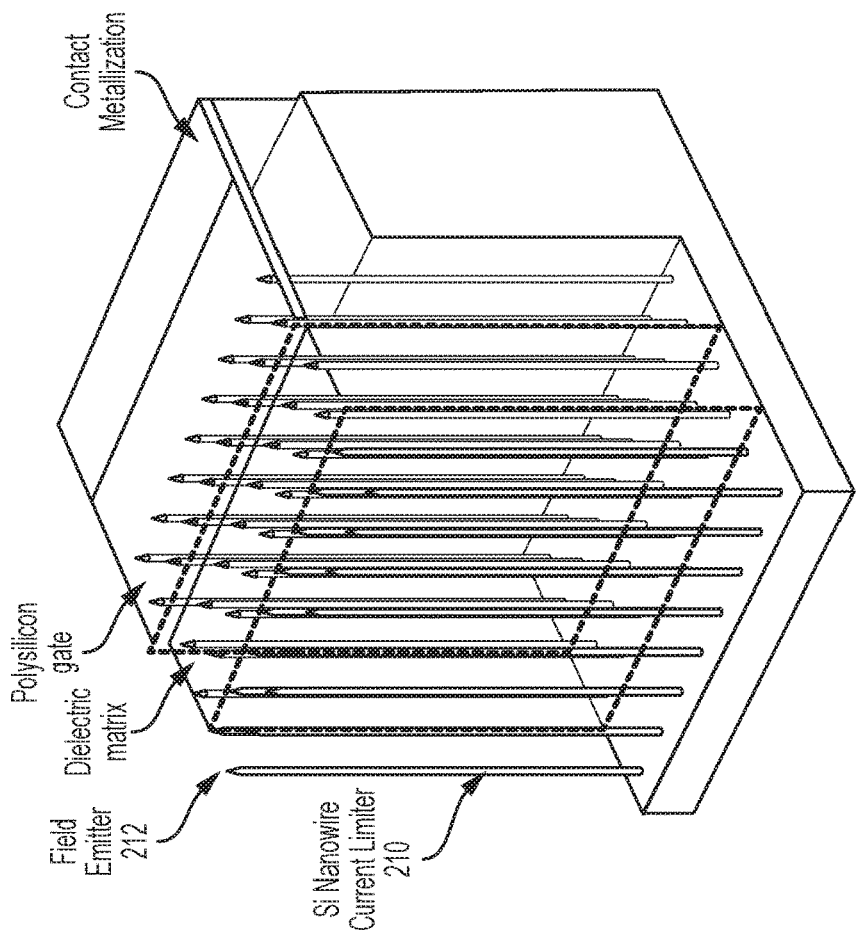

FIGS. 2A and 2B illustrate exemplary cold cathodes for use with some embodiments. The cold cathodes demonstrated high current density silicon field emitter arrays with potential for long lifetime at low operating voltages. Silicon field emitter arrays (FEAs) that demonstrated current densities >100 A/cm$^2$ at gate-emitter voltages <75 V were previously reported. These are the highest current densities ever reported for a semiconductor FEA, and approach the current densities of Spindt-type metal cathodes. The reported results were achieved using a new device structure that employs high-aspect-ratio silicon nanowire current limiters 210 in series with each emitter 212 tip to address the major failure mechanisms in FEAs. These current limiters mitigate emitter tip failure due to joule heating thus allowing for higher reliability. A novel fabrication process was employed to produce small gate apertures (~350 nm) that are self-aligned to the field emitter tip enabling device operation at >100 A/cm2 with gate-to-emitter voltages that are <75 V. The high current density (J>100 A/cm$^2$) cold cathode based on silicon FEAs operated at low voltage (V$_{GE}$<60 V), and had long lifetime (T>100 hours @ 100 A/cm$^2$, T>100 hours @ 10 A/cm$^2$, T>300 hours @ 100 mA/cm$^2$).

FIG. 2A shows a 3-D rendering of a device structure for a cold cathode for use with some embodiments. For clarity, layers have been omitted in different regions of the rendering to show detail. In the front, the bare silicon nanowires (200 nm diameter and 10 μm height) with sharp tips are shown. FIG. 2B shows a top view of a fabricated device with 350 nm gate aperture and 1 μm tip-to tip spacing.

In some embodiments, the current density and lifetime of cold cathodes has a lifetime of 250 hours @ current density of J=100 A/cm$^2$ for small sized arrays and 100 hours @ J=100 A/cm$^2$ for medium sized arrays. This is accomplished by (a) improving the mesa formation process to remove the sharp ridge formed at the perimeter of the mesa that is believed to lead to Time Dependent Dielectric Breakdown (TDDB) and degrade lifetime of the cathodes, (b) using a process for depositing a thin noble metal (e.g., Ir/Pt) coating on the silicon tips and (c) optimizing the tip etch process to reduce the tip radius dispersion to $\sigma_{rtip}$ 1.00 nm using a tri-level resist process. Some device structures in accordance with some embodiments address at least four main challenges that have thus far prevented field emission devices from attaining high performance and long lifetime: (1) breakdown of the insulator between the emitter substrate and the extraction gate due to charge injection into the insulator, (2) emitter tip burnout due to Joule heating, thermal runaway, or cathodic arcs, (3) emitter tip erosion due to bombardment by back-streaming ions generated from gas molecules desorbed from the anode, gate or other surfaces in the VED and (4) the large capacitance between the gate and the substrate which leads to large stored energy and hence potential for catastrophic failure and limited high frequency performance.

Figure 3:
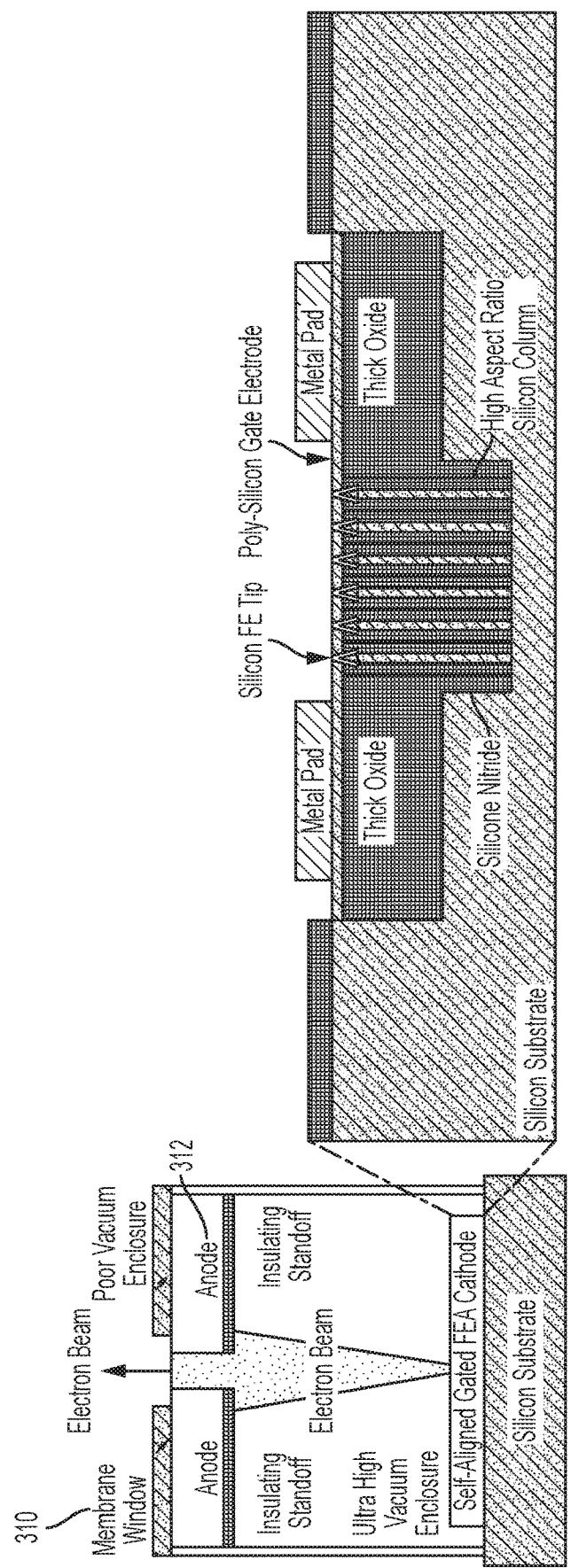
FIG. 3 illustrates a cold cathode structure for use with some embodiments.

Some embodiments include an electron transparent window structure, which together with the field emitter array constitutes the Modular Cold Cathode Structure shown in FIG. 3. FIG. 3 illustrates a modular compact cathode based on a 2D array of self-aligned gated field emitters individually regulated by silicon nanowire current limiters and a thin membrane anode that is transparent to emitted electrons on the ultra-high vacuum (UHV) side but impervious to gas molecules on the poor vacuum side. In one implementation, the pressure differential on the membrane may be approximately 10 Torr.

Figure 4B:
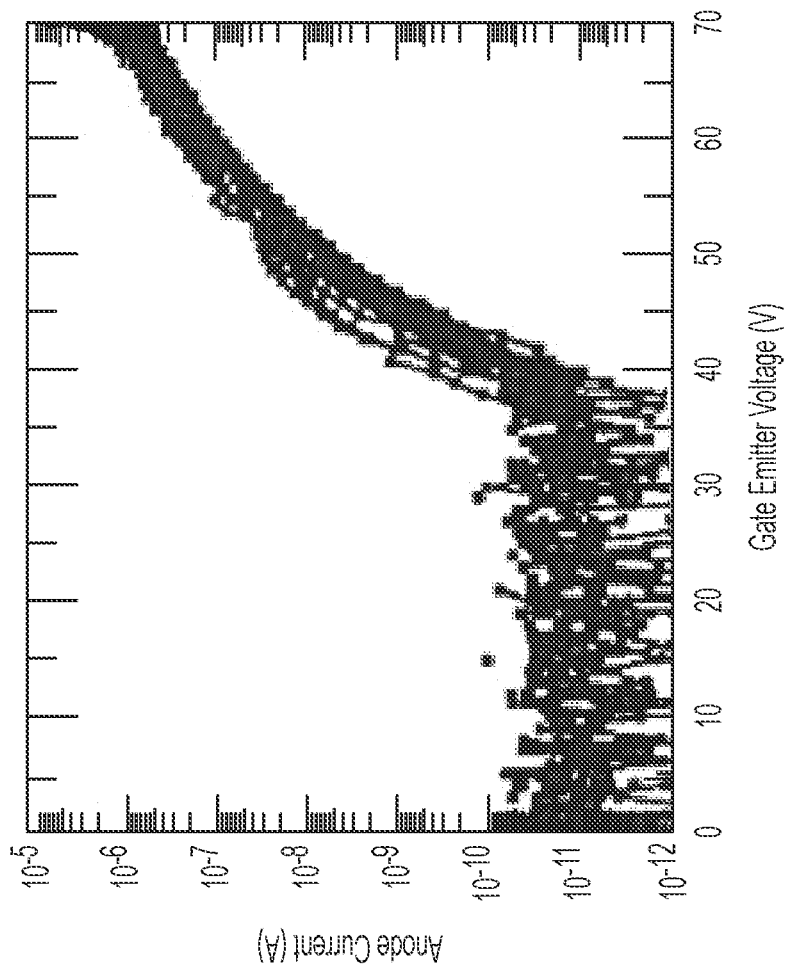
FIG. 4B is a plot of I-V characteristics of the device as shown in FIG. 4A.
Figure 4A:
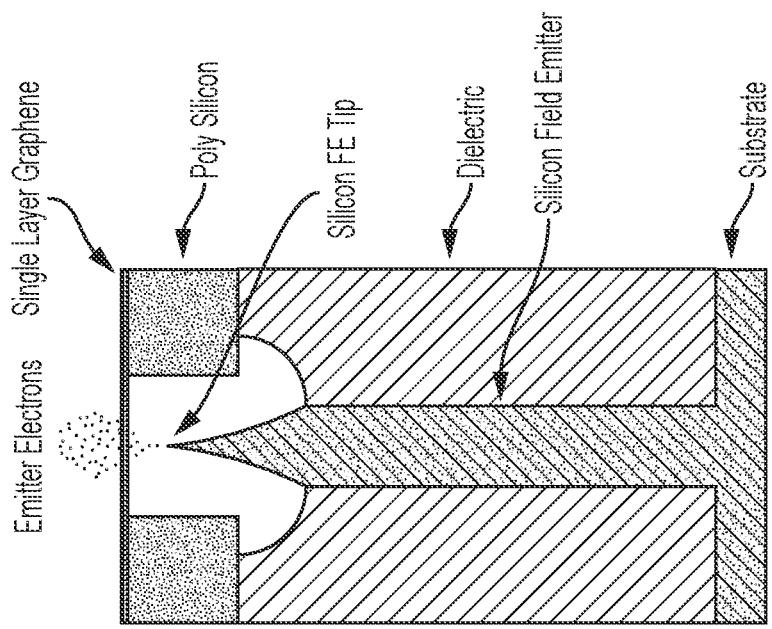
FIG. 4A illustrates a field emitter array with an electron transparent gate for use with some embodiments.

The cathode structure shown in FIG. 3 and fabricated using MEMS technology uses a thin membrane window 310 that is transparent to electrons but impervious to gas molecules and ions. The membrane window 310 may include a single or multiple layers of material, examples of which include, but are not limited to, graphene, silicon nitride and amorphous silicon. The Modular Cold Cathode Structure may be modeled using multi-physics simulation packages that include mechanical, thermal, electromagnetic, electron trajectory, and electron transport through membranes. FIGS. 4A and 4B show an example of a field emitter array with an electron transparent gate that demonstrates the feasibility of an electron transparent window for use with some embodiments. As shown, FIG. 4A illustrates a Field Emitter Array with one Electron Transparent Graphene Gate showing that the graphene layer is transparent to emitter electrons at extraction gate voltages as low as 40 V, as confirmed by the I-V characteristics of the device as shown in FIG. 4B.

Figure 5B:
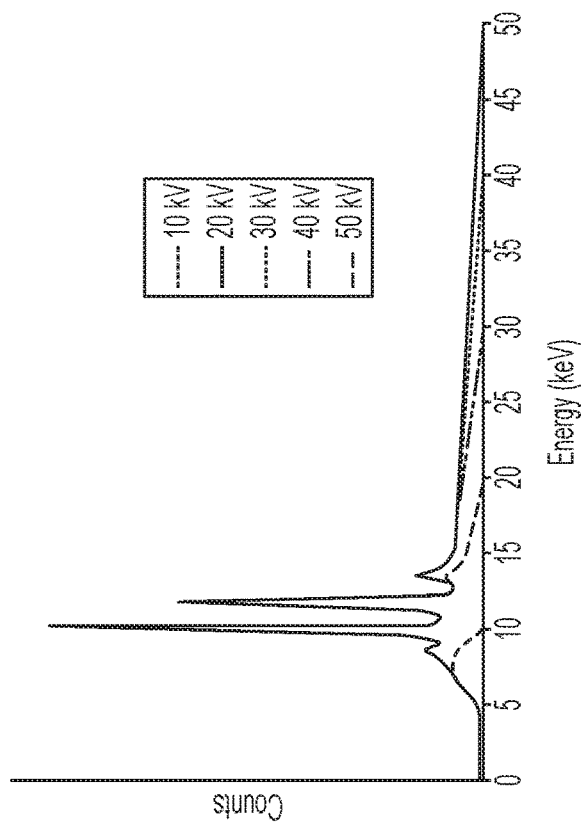
FIG. 5B is a plot of an example of characteristic x-ray spectra as a function of acceleration voltage for the anode structure of FIG. 5A.
Figure 5A:
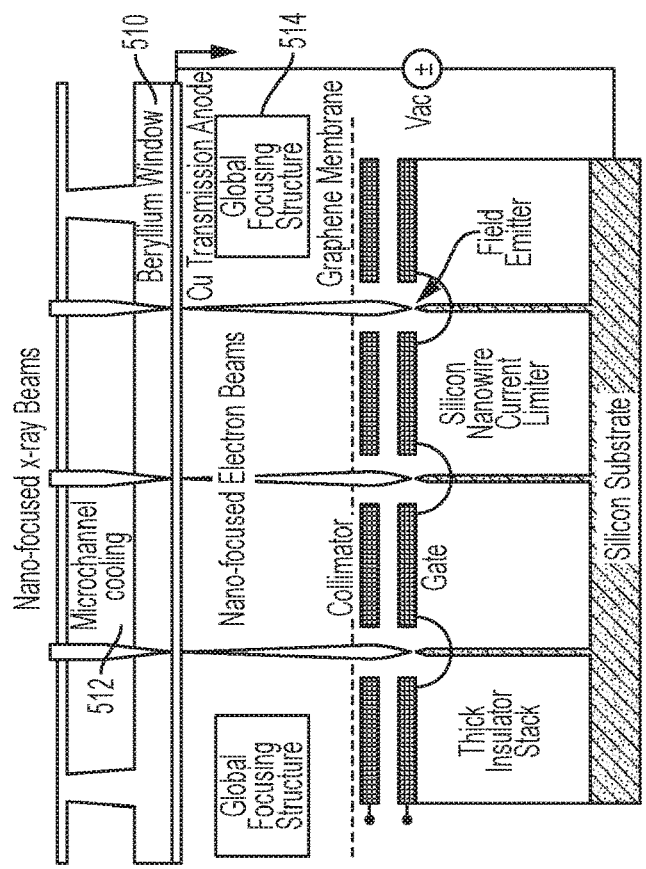
FIG. 5A illustrates an anode structure for use with some embodiments.

FIGS. 5A and 5B shows an example of an anode structure for anode 312 that may be used in accordance with some embodiments. In one implementation, a Beryllium (BE) substrate 510 and x-ray generating metal layers with appropriate core level transitions are used. Anode 312 is designed to generate characteristic x-rays with photon energies from 10-30 KeV. Due to waste heat generated in a small volume, some embodiments include integrated cooling microchannels 512 to dissipate the heat. FIG. 5A shows a transmission anode consisting of a cooling manifold made of Be, and a monometallic anode plate. The thickness of Be in the anode window 510 may be be matched to that required for filtering out very low energy radiation. FIG. 5B shows an example of characteristic X-ray Spectra as a function of acceleration voltage. Some embodiments are focused on increasing thermal loads and as well as for obtaining improved x-ray signals.

The high cathode emitter density and tight focus of some embodiments result in large heating rates at the anode, which may thermally limit the operating and design space of the electron gun. Previous anode design work was successful in identifying non-rotating designs capable of dissipating 500 W/cm$^2$ over 1 μm spots with a 10% duty cycle. Some embodiments involve much smaller (e.g., 1/200) spots and may allow for higher duty cycles (e.g., up to 100% duty cycles). While some previous microchannel-cooled anode designs had some margin for requirements growth, they were not capable of accommodating these conditions, and thus represent a critical barrier to fully exploit the capabilities of the cathode array. In some embodiments, the thermal management capabilities of the device are scaled up by at least an order of magnitude to avoid down-rating of the gun. This is accomplished in some embodiments through aggressive reduction of microchannel scale and pitch.

The anode designs to date have not been optimized for x-ray generation, in terms of tailoring the material, geometry and design features. Improving the x-ray beam by reducing/eliminating electron backscatter and tailoring the anode to provide optimum x-ray transmission, without compromising the already-stressed thermal performance, offers cleaner imaging and the prospect for reduced imaging times. Faraday cups and anode feature shaping are used in some embodiments to suppress electron backscatter, and the material layers and thicknesses are varied to optimize the x-ray transmission spectra.

Electrons emitted from field emitter tips that have a radius of 5±1 nm should be focused to the same size at the anode. This creates a challenge because of the high current densities (e.g., $10^6$ A/cm$^2$) involved. The electron beams have the potential to blur because of space charge. In some embodiments, a global focusing structure 514 is included to focus each individual beamlet on the anode.

X-Ray Optics for 3D IC Tomography

Figure 6:
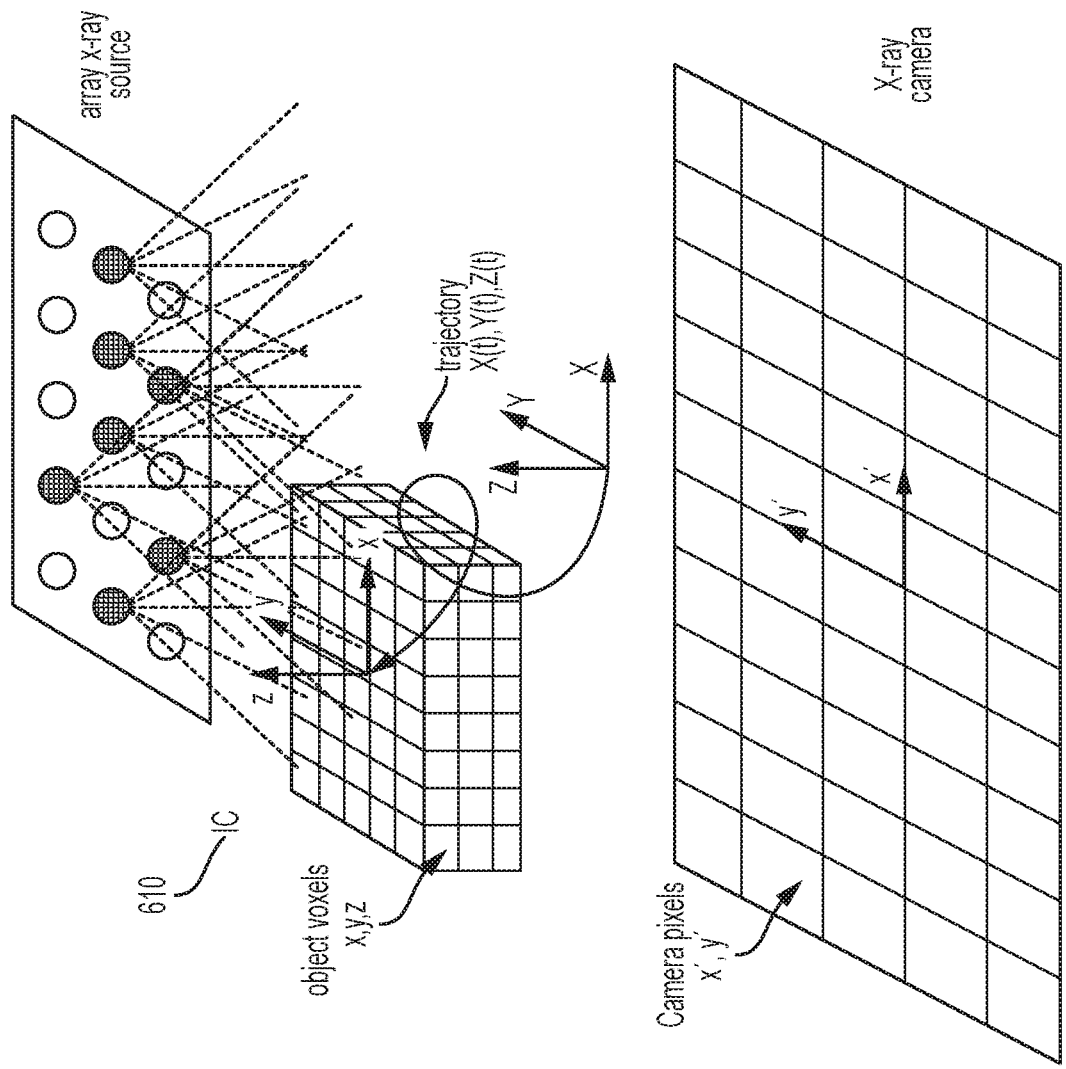
FIG. 6 schematically shows operating principles of an imaging device designed in accordance with some embodiments.

FIG. 6 shows operating principles of an imaging device designed in accordance with some embodiments. As shown, an IC die 610 is mounted on a 3-axis stage, and the stage is programmed to execute a trajectory X(t), Y(t), Z(t) as function of acquisition time t. As the stage moves, sources in the array are turned on and off selectively, while the detector (e.g., x-ray camera) obtains intensity images. In the example shown in FIG. 6, the sources (filled circles) are turned on, whereas all other sources (unfilled circles) are turned off. At the next time step, a different set of sources are turned on to acquire an image at point X(t+1), Y(t+1), Z(t+1) on the trajectory. To avoid motion blur, the stage motion may be programmed to be "step-wise." For example the stage may have sequential target positions and, every time it reaches a target the stage dwells (stops) until the image is acquired, prior to moving to the next target position. The images may be denoted as $I_{XYZ}$ (x',y'), where (x',y') denotes the coordinates on the detector.

The set of intensities $I_{XYZ}$ (x',y') constitute the captured data used to reconstruct absorption and phase images of the IC in accordance with some embodiments. The absorption and phase images may be denoted as a(x,y,z) and ϕ(x,y,z), respectively. Here, (x,y,z) denote the coordinates on the IC, and can be thought as "voxels" of size 10 nm×10 nm×10 nm, or some other suitable voxel size. Physically, a(x,y,z) represents loss of x-ray photons due to absorption by atomic nuclei; therefore, at each voxel, a(x,y,z) may be determined primarily by the Z number of the elements within that voxel. On the other hand, ϕ(x,y,z) is determined by the dipole moment interactions between x-ray photons and the electron clouds of the elements within the voxel. Phenomenologically, this interaction is commonly referred to as "index of refraction," and results in phase delay of the electromagnetic wave as it passes through matter. The interaction may be expressed simply as the complex transmittance ψ(x,y,z)=a $(x,y,z)e^{i\phi(x,y,z)}$. It turns out that the two interactions, absorption and phase delay, are related through the Kramers-Kronig relationship that guarantees causality. Therefore, $a(x,y,z)$ may be written as $\varphi(x,y,z)\gamma(\lambda)$, where $\gamma(\lambda)$ is a material- and wavelength-dependent coefficient. This relationship constitutes a strong prior, which is exploited in some embodiments to improve phase contrast from weakly absorbing objects.

The nature of the interactions a and y determine the "forward operator," which may be denoted as H. To construct H, two approximations are commonly used: the Born approximation, which assumes a weak phase object; and the Rytov approximation, which assumes weak gradients in the object's phase. The Rytov approximation is commonly used in the x-ray regime, as typically the weak gradient assumption is satisfied, whereas the phase delays may actually be significant. Some embodiments test this assumption against rigorous models as well as lab-bench experiments with known (calibrated) targets; and incorporate corrections into the construction of the forward operator. Assuming that the Rytov model holds, the phase of the field after propagating through the object may be expressed as:

$$\chi(\vec{r}'') = \frac{1}{g_{inc}(\vec{r}'')} \int \int \int_{\substack{object \\ volume}} g_{inc}(\vec{r})(1-\phi^2(\vec{r}))G(\vec{r}''-\vec{r})d^3\vec{r}, \quad (1)$$

where $g_{inc}(\vec{r})$ is the incident field; $G(\vec{r})$ is Green's function of free space; and $\vec{r}=(x,y,z)$, $\vec{r}''=(x'',y'')$ are the coordinates within the object volume and on plane immediately beneath the object, respectively. The operator H is finally constructed by propagating the resulting attenuated and phase-delayed field from the plane $\vec{r}''=(x'',y'')$ to the detector (e.g., camera) plane $\vec{r}'=(x',y')$. The build-up of the forward operator H is complemented in some embodiments with experimental measurements, especially of the depth point spread function (PSF) as a spatially variant function under a certain limited scanning geometry, to improve the condition of the inverse problem.

Image Acquisition and Tomosynthetic Reconstruction

In some embodiments, the IC die is mounted on a high-precision nano-positioning stage, an example of which is discussed above in connection with FIG. 1. The mounted IC die may be sequentially exposed to x-ray illuminations in a coded fashion as discussed above. The x-ray optical chain described above in connection with FIG. 6 focuses the x-ray beam on a high-resolution detector in order to provide a set of projection images of the IC. In some embodiments, these projection images are reconstructed into a 3D image stack of planar images using a tomosynthesis algorithm.

Some embodiments combine coded source (structured) illumination, with strong priors applicable to ICs to define a tomosynthesis algorithm as an inverse problem, as follows:

Given the set of measurements $I_{XYZ}(x',y')$, find the complex transmittance $\psi(x,y,z)$ that minimizes the Error Functional $$\|I_{XYZ}(x',y')-H\psi(x,y,z)\|^2+\mu R(\psi), \quad (2)$$

where $R(\psi)$ is a regularizer expressing prior knowledge about the complex transmission function, as discussed in more detail below, and $\mu$ is the regularization parameter. Alternatively, the problem may be posed as one of constrained optimization:

$$\text{Minimize } R(\psi) \text{ subject to } \|I_{XYZ}(x',y')-H\psi(x,y,z)\|^2<\varepsilon, \quad (3)$$

where $\varepsilon$ is a "robustness" parameter expressing confidence in the final estimate deviating from the data in order to avoid over fitting.

A broad range of optimization techniques are available for tackling this class of problems, e.g. TwIST for (2), Matching Pursuit and its variants (e.g., Orthogonal Matching Pursuit) for (3), and others. Different techniques can be compared in terms of performance, including accuracy of reconstruction with simulated and calibration samples; and in terms of convergence speed.

The choice of regularizer $R(\psi)$ may be important. If $\psi$ belongs to a class of objects that can be expressed sparsely, i.e., a set of basis functions exists such that the projection of $\psi$ to this set yields very few non-zero coefficients, then equations (2) and (3) can be proven to converge to the correct solution with probability near 1 even if the measurements are severely undersampled. A limit indeed exists as to how many samples are required at the minimum to obtain the high quality reconstruction; below this limit, the reconstruction typically fails. However, most classes of objects of interest are indeed "sparsifiable," i.e., a set of basis functions does indeed exist in which the objects in the class are sparse.

Sparsity criteria can be very general. In the case of IC dies that are of interest for imaging with an imaging system designed in accordance with some embodiments, priors that can be translated into sparsity are: the Manhattan geometry of the ICs; the layering into equally spaced, parallel layers; and the presence of a limited number of elements whose indices of refraction in the x-ray regime has been tabulated for various stoichiometries and obey the phase-attenuation duality relationship. Moreover, the random multiplexing of several sources at each measurement, as shown in FIG. 6, meets the "incoherence" criterion of compressive sensing. Optimization schemes generally allow for the inclusion of other constraints, e.g. positivity of the absorption coefficient $a(x,y,z)$, In some embodiments, an ad hoc approach is applied to determine the regularizer $R(\psi)$ according to the criteria described above. This technique has yielded good results in prior work. To further enhance resolution, some embodiments adopt a "learning-enhanced inversion" approach. Some embodiments train a compressed representation of imaged ICs (e.g., an overcomplete dictionary or set of neural network hidden units) using high-resolution images of sample/representative ICs. The dictionary may be used to denoise and enhance the resolution of the computationally reconstructed images. Dictionary learning is particularly suitable for some embodiments since the number of elements in an IC should be limited and the patterns of these elements should be easy to learn.

A tomosynthesis algorithm in accordance with some embodiments is capable of classifying each voxel (e.g., according to material composition, part of a standard circuit component such as a logic gate, etc.) for identifying areas of interest. These computational imaging and learning-enhanced approaches yield a "compressive" gain, defined as:

G=number of voxels (unknowns) in the object/number of measurements.

As a rule of thumb, the number of measurements required to obtain a 3D reconstructed image approximately equals the number of voxels desired to reconstruct, i.e., G≈1; in turn, that is determined by the desired resolution. For an IC of lateral size 1 mm×1 mm and thickness 100 μm, and desired resolution of 10 nm×10 nm×10 nm, 50,000×50,000×5000 voxels are required. Collecting so many measurements is typically impractical; instead, by using sparse representations and the inversion formalisms using equations (2) or (3) in accordance with some embodiments, the same amount of information may be obtained but with a much smaller number of measurements, i.e. G>>1. Because there are limited number of elements in the IC images, the image representation are generally sparse, and the compress gains in the Table 1 below may be achieved in some embodiments.

Experimental Calculations for Performance Estimates

To determine the acquisition time required, the expected exposure time per image and total number of images required for reconstruction were computed. The results are summarized in Table 1.

| Resolution | Reconstruction volume | Detector Resolution | Compress gain | Exposure time | Acquisition time |
|---|---|---|---|---|---|
| 20 nm | 50,000 × 50,000 × 2500 | 3000 × 3000 | 20 | 38.4 s | 15.43 days |
|  |  |  |  | 1.92 s | 18.5 hours |
| 10 nm | 100,000 × 100,000 × 5000 | 3000 × 3000 | >20 | <1.92 s | <6.2 days |
| 10 nm | 100,000 × 100,000 × 5000 | 3000 × 3000 | >20 | <1.92 s | <6.2 days |

The photon flux at each detector pixel as function of number of photons generated by each nano-focused source is $$P_{detector} = P_{source} M \eta e^{N \mu d},$$

where $P_{detector}$ is the intensity at the detector, $P_{source}$ is the intensity of the source, M is the number of sources simultaneously illuminating the detector, $\eta$ is the fraction of photons emitted per source that are captured by the detector (for a 1 μm pixel size and a 1 cm source-to-detector distance, $\eta = 7.958 \times 10^{-10}$), and $e^{N \mu d}$ is the transmission coefficient of the IC. For a 5 nm focal spot size, an imaging system in accordance with some embodiments is expected to deliver 10 mW of power per anode. The estimated photon production efficiency of the system is 1%. The expected photon intensity that the source emits in all directions ($P_{source}$) is $6.242 \times 10^{6}$ photons/s.

To estimate the attenuation introduced by the IC, a representative IC for which the silicon substrate has been thinned to 50 μm, and consisting of: a 50 μm thick silicon substrate, 26 layers of 100 nm thick silicon nitride, and 13 layers of 100 nm thick copper vias was considered. The transmission coefficient for this IC at 10 keV X-ray energies is 0.5243.

On average it is expected to capture 1000 X-ray photons per pixel to generate a useable image with noise variance. For M=1, or single source imaging, this results in an exposure time of 38.4 s. To further increase the photon flux and decrease the required exposure time, coded illumination patterns with M~20 may be used, resulting in an exposure time of 1.92 s.

To calculate overall acquisition time, the number of images necessary to reconstruct the IC region of interest was considered. High-resolution X-ray detectors typically provide 9 megapixels of resolution. An IC having a region of interest of 1 mm×1 mm×0.05 mm was assumed. Aiming at a "compressive gain" of 20× and using the multiple images acquired on the spiral-like trajectory of FIG. 6 to obtain the rest of the necessary data, the expected acquisition times of Table 1 were calculated. In some embodiments, exposure time may be reduced by improvements in source flux, detector efficiency, and/or optimization of the imaging geometry. Compressive gain may also improve as machine learning algorithms are incorporated.

To achieve the lateral resolution required for IC imaging, some embodiments combine geometric magnification with computational imaging. Starting with a detector pixel pitch of 1 μm, geometric magnification is used in some embodiments, as shown in FIGS. 1A and 6. In some implementations, a magnification factor of 12.5-100 may be used, resulting in an effective pixel size of 10-80 nm. To increase the resolution of the system, computational imaging using structured illumination from the x-ray source may be used with one or more of the inversion tomosynthetic algorithms discussed above. Coded illumination and synthetic aperture imaging have been shown to improve effective resolution by a factor of 4 in each direction, and by exploiting the additional strong priors of Manhattan geometry, phase-attenuation duality, and material composition, further gains in resolution are achievable. Using conservative estimates, a system designed in accordance with some embodiments will achieve a lateral resolution of 2.5-20 nm.

For computational imaging, unlike direct imaging techniques such as confocal microscopy, the vertical resolution is not as clearly defined as the lateral resolution. It is useful to consider the depth of field of the system as a loose lower bound to the vertical resolution. For computational imaging methods such as coded illumination and tomosynthesis, the effective numerical aperture of the system is much larger than the numerical aperture of the optical system because many views of the object are captured from many angles or patterns of illumination. In tomosynthesis reconstruction, this effect manifests as a blurring between reconstruction planes. Compressive tomosynthesis methods have been shown to greatly improve vertical resolution, allowing for reconstruction slices at a resolution comparable to the lateral resolution. The techniques described herein combine features from ptychography and compressive tomography in conjunction with strong priors, and, optionally, learning-enhanced inversion methods; hence, the vertical resolution of a system designed in accordance with some embodiments will achieve a vertical resolution approximately equal the lateral resolution (e.g., 2.5-20 nm).

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware or with one or more processors programmed using microcode or software to perform the functions recited above.

In this respect, it should be appreciated that one implementation of the embodiments of the present invention comprises at least one non-transitory computer-readable storage medium (e.g., a computer memory, a portable memory, a compact disk, etc.) encoded with a computer program (i.e., a plurality of instructions), which, when executed on a processor, performs the above-discussed functions of the embodiments of the present invention. The computer-readable storage medium can be transportable such that the program stored thereon can be loaded onto any computer resource to implement the aspects of the present invention discussed herein. In addition, it should be appreciated that the reference to a computer program which, when executed, performs the above-discussed functions, is not limited to an application program running on a host computer. Rather, the term computer program is used herein in a generic sense to reference any type of computer code (e.g., software or microcode) that can be employed to program a processor to implement the above-discussed aspects of the present invention.

Various aspects of the present invention may be used alone, in combination, or in a variety of arrangements not specifically discussed in the embodiments described in the foregoing and are therefore not limited in their application to the details and arrangement of components set forth in the foregoing description or illustrated in the drawings. For example, aspects described in one embodiment may be combined in any manner with aspects described in other embodiments.

Also, embodiments of the invention may be implemented as one or more methods, of which an example has been provided. The acts performed as part of the method(s) may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. An imaging system for imaging an integrated circuit (IC), the imaging system comprising:
an x-ray source including a plurality of spatially and temporally addressable electron sources, each electron source comprising a spatially and temporally addressable gate operable to selectively activate electron emission from the electron source;
an x-ray detector arranged such that incident x-rays are oriented normal to an incident surface of the x-ray detector;
a three-axis stage arranged between the x-ray source and the x-ray detector, the three-axis stage configured to have mounted thereon an integrated circuit through which x-rays generated by the x-ray source pass during operation of the imaging system; and
at least one controller configured to:
move the three-axis stage during operation of the imaging system; and
selectively activate a subset of the electron sources during movement of the three-axis stage to acquire a set of intensity data by the x-ray detector as the three-axis stage moves along a three-dimensional trajectory.

2. The imaging system of claim 1, wherein the plurality of spatially and temporally addressable electron sources comprise a plurality of silicon field emitter tips.

3. The imaging system of claim 2, wherein the plurality of silicon field emitter tips include a silicon nanowire current limiter.

4. The imaging system of claim 2, wherein for each of the plurality of electron sources:
the gate is operable to activate electron emission from a field emitter tip of the plurality of silicon field emitter tips upon application of a voltage of less than 75 V between the gate and the field emitter tip.

5. The imaging system of claim 1, wherein the x-ray source further comprises an anode structure disposed between the plurality of electron sources and the x-ray detector, the anode structure configured to generate x-rays upon collision with electrons generated by the plurality of electron sources and to transmit the generated x-rays toward the x-ray detector.

6. The imaging system of claim 5, wherein the anode structure comprises a thin membrane window.

7. The imaging system of claim 6, wherein the x-ray source comprises an ultra-high vacuum enclosure arranged between the plurality of electron sources and the thin membrane window.

8. The imaging system of claim 6, wherein the thin membrane window comprises one or more graphene layers.

9. The imaging system of claim 5, wherein the x-ray source further comprises a plurality of cooling microchannels formed within the anode structure.

10. The imaging system of claim 5, wherein the x-ray source further comprises at least one global focusing structure arranged to focus an electron beamlet output from each of the plurality of electron sources on the anode structure.

11. The imaging system of claim 1, wherein the at least one controller is configured to move the three-axis stage in a step-wise fashion to each of a plurality of sequential target positions to reduce motion blur.

12. The imaging system of claim 1, wherein the at least one controller is configured to move the three-axis stage with a 1 nm translation resolution and 7 mm travel in an x-y plane parallel to the x-ray detector and a 0.2 nm resolution and 100 μm travel in a z-direction perpendicular to the x-y plane.

13. The imaging system of claim 1, wherein the x-ray detector comprises a high resolution camera having a resolution of at least 36.3 Megapixels.

14. The imaging system of claim 1, wherein the x-ray detector comprises a scintillator plate and magnifying optics to achieve an effective pixel size of 1 μm or smaller.

15. The imaging system of claim 1, further comprising at least one processing computer configured to:
receive the set of intensity data from the x-ray detector captured along the three-dimensional trajectory; and perform a tomosynthesis reconstruction process using the set of intensity data to reconstruct a three-dimensional image of the integrated circuit.

16. The imaging system of claim 15, wherein performing a tomosynthesis reconstruction process comprises reconstructing absorption and phase images of the integrated circuit.

17. The imaging system of claim 16, wherein the at least one processing computer is further configured to distinguish different materials in the integrated circuit based on an analysis of the absorption and phase images.

18. The imaging system of claim 15, wherein performing a tomosynthesis reconstruction process comprises solving an inverse problem using a sparse representation of an image representation.

19. The imaging system of claim 1, wherein the three-dimensional trajectory is a three-dimensional spiral.

20. The imaging system of claim 1, wherein the at least one controller is further configured to:
  construct an image of the integrated circuit based on the acquired set of intensity data, the image having a resolution of 20 nm or less.

21. A method of imaging an integrated circuit using an imaging device comprising a plurality of electron sources, an x-ray detector and a three-axis stage arranged between the plurality of electron sources and the x-ray detector and configured to have mounted thereon the integrated circuit, the method comprising:
  moving, using at least one controller, the three-axis stage along a three-dimensional trajectory during operation of the imaging device;
  activating a first subset of the electron sources to acquire a first set of intensity data by the x-ray detector when the three-axis stage is at a first position along the three-dimensional trajectory;
  activating a second subset of the electron sources different from the first subset to acquire a second set of intensity data by the x-ray detector when the three-axis stage is at a second position different from the first position along the three-dimensional trajectory; and
  performing a tomosynthesis reconstruction process using the first and second sets of intensity data.

22. An imaging system for imaging an integrated circuit (IC), the imaging system comprising:
  an x-ray source including a plurality of spatially and temporally addressable electron sources and a transmission-type anode;
  an x-ray detector arranged such that incident x-rays are oriented normal to an incident surface of the x-ray detector, wherein the transmission-type anode is disposed between the plurality of electron sources and the x-ray detector;
  a three-axis stage arranged between the x-ray source and the x-ray detector, the three-axis stage configured to have mounted thereon an integrated circuit through which x-rays generated by the x-ray source pass during operation of the imaging system; and
  at least one controller configured to:
    move the three-axis stage during operation of the imaging system; and
    selectively activate a subset of the electron sources during movement of the three-axis stage to acquire a set of intensity data by the x-ray detector as the three-axis stage moves along a three-dimensional trajectory.

* * * * *